Figure 1:
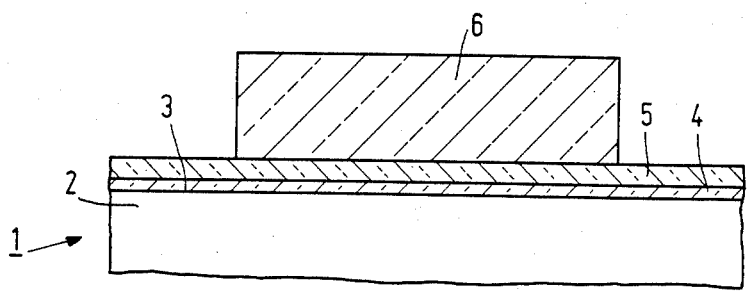
Figure 2:
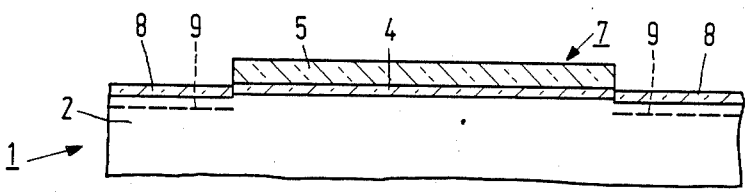
Figure 3:
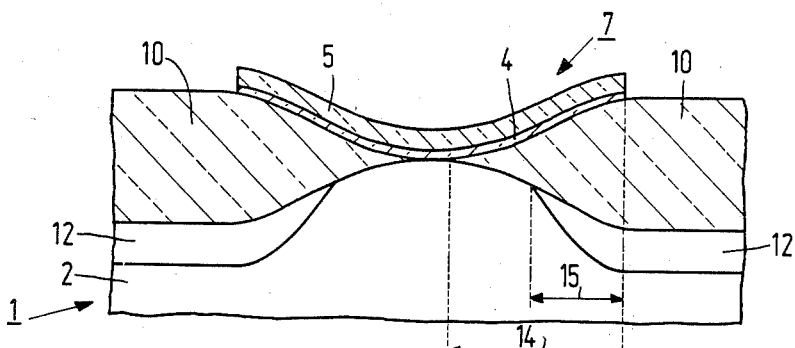

United States Patent [19]

Bastiaens et al.

[11] Patent Number: 4,743,566
[45] Date of Patent: May 10, 1988

[54] METHOD OF MANUFACTURING A SEMICONDUCTOR DEVICE, IN WHICH A SILICON SLICE IS LOCALLY PROVIDED WITH FIELD OXIDE WITH A CHANNEL STOPPER

[75] Inventors: Jozef J. J. Bastiaens; Marcus A. Sprokel, both of Eindhoven, Netherlands

[73] Assignee: U.S. Philips Corp., New York, N.Y.

[21] Appl. No.: 869,482

[22] Filed: Jun. 2, 1986

[30] Foreign Application Priority Data

Jun. 14, 1985 [NL] Netherlands .......................... 8501720

[51] Int. Cl.[4] ................................ H01L 21/76
[52] U.S. Cl. .......................... 437/70; 148/81; 148/163; 148/117; 148/118; 357/11; 357/41; 357/50; 156/653; 437/69; 437/240; 437/239; 437/241
[58] Field of Search .............. 29/576 B, 576 W, 578, 29/571, 580; 148/187, DIG. 117, 118, DIG. 81, DIG. 163; 156/653; 357/23.11, 50, 41

[56] References Cited

U.S. PATENT DOCUMENTS

| | | | |
|---|---|---|---|
| 4,110,899 | 9/1978 | Nagasawa et al. | 29/571 |
| 4,268,321 | 5/1981 | Meguro | 148/187 |
| 4,407,696 | 10/1983 | Han et al. | 29/576 W |
| 4,551,910 | 11/1985 | Patterson | 29/576 W |
| 4,569,117 | 2/1986 | Baglee et al. | 29/576 W |
| 4,574,465 | 3/1986 | Rao | 29/571 |
| 4,577,394 | 3/1986 | Peel | 29/576 W |
| 4,601,098 | 7/1986 | Oda | 29/576 W |
| 4,622,096 | 11/1986 | Dil et al. | 29/576 W |

FOREIGN PATENT DOCUMENTS

| | | | |
|---|---|---|---|
| 0071203 | 7/1982 | European Pat. Off. | 437/70 |
| 60-128635 | 7/1985 | Japan | 437/70 |

Primary Examiner—Brian E. Hearn
Assistant Examiner—Beverly A. Pawlikowski
Attorney, Agent, or Firm—Paul R. Miller

[57] ABSTRACT

A method of manufacturing a semiconductor device, in which a silicon slice (1) is locally provided with field oxide (10, 30) with a subjacent channel stopper zone (12, 32), which are formed during the same oxidizing heat treatment. The formed field oxide layer (10, 30) is removed in part by an etching treatment with a thinner and smaller field oxide layer (11, 31) being formed. The temperature at which the heat treatment is carried out is chosen so that lateral diffusion (15, 35) of the dopant forming the channel stopper zone (12, 32) extends in lateral direction practically over the same distance as the reduced field oxide layer (11, 31). Thus, it is achieved that, for example, for the manufacture of a MOS transistor an oxidation mask (7) having substantially the same width as a channel zone (17) to be formed can be used.

14 Claims, 4 Drawing Sheets

METHOD OF MANUFACTURING A SEMICONDUCTOR DEVICE, IN WHICH A SILICON SLICE IS LOCALLY PROVIDED WITH FIELD OXIDE WITH A CHANNEL STOPPER

The invention relates to a method of manufacturing a semiconductor device, in which an oxidation mask is locally provided on a surface of a silicon slice, after which in order to succession a surface layer of the slice laterally adjoining the oxidation mask is provided with atoms of a dopant, the slice is subjected to a first oxidizing heat treatment, in which by oxidation of the part of the slice not covered by the oxidation mask a layer of field oxide is formed and by diffusion of the atoms of the dopant a channel stopper zone located beneath the field oxide is formed, the oxidation mask is etched away and the slice is subjected to a second oxidizing heat treatment, in which a layer of gate oxide located between field oxide is formed.

Such a method is particularly suitable for the manufacture of semiconductor devices comprising a large number of MOS transistors, such as electronic memories.

U.S. Pat. No. 4,268,321 discloses a method of the kind mentioned in the opening paragraph, in which the first oxidizing heat treatment is carried out at a temperature of about 1000° C. The oxidation mask then consists of a stress-relieving bottom layer of silicon oxide and an oxidation-retarding layer of silicon nitride. Problems arise with the use of the known method of manufacturing semiconductor devices comprising MOS transistors having channel zones enclosed between field oxide with a channel stopper zone and having a width of 1 $\mu$m or less. Due to lateral oxidation and diffusion, the field oxide layer and the channel stopper zone extend as far as beneath the oxidation mask and the widths of the oxidation mask and of the channel zone deviate comparatively strongly from each other. In the known method, in which the oxidizing heat treatment is carried out at 1000° C., when forming a field oxide layer having a thickness of about 0.4 $\mu$m, the lateral oxidation is about 0.6 $\mu$m and the lateral diffusion is about 0.8 $\mu$m. In order to obtain a channel zone having a width of about 1 $\mu$m, the starting member should therefore be an oxidation mask having a width of about 2.6 $\mu$m. Beside this problem, the problem further arises that nitride is formed during the first oxidizing heat treatment at the area of the transition between silicon and the stress-relieving bottom layer of silicon oxide of the oxidation mask along the edge of the oxidation mask; a so-called white ribbon is formed here. When forming a very thin gate oxide having a thickness of about 25 nm, as is required for small MOS transistors, this nitride can be very disturbing.

The invention has inter alia for its object to provide a method by means of which it is possible to manufacture a semiconductor device comprising MOS transistors, in which for obtaining channel zones having a width of 1 $\mu$m or less, oxidation masks having a width not substantially deviating therefrom can be used and by which it is also possible to provide very thin gate oxide without the disturbing influence of "white ribbon nitride".

According to the invention, the method mentioned in the opening paragraph is for this purpose characterized in that after etching away the oxidation mask the slice is subjected to a further etching treatment, in which also a part of the field oxide layer formed in etched away with this layer becoming thinner and in lateral direction smaller, and in that the first oxidizing heat treatment is carried out at a temperature at which a channel stopper zone is formed, which extends in the lateral direction practically over the same distance as the field oxide layer reduced in dimensions by the etching treatment.

Since the field oxide layer formed during the first oxidizing heat treatment has a thickness decreasing towards the edge, the field oxide layer becomes during the further etching treatment not only thinner, but also smaller. The first heat treatment is carried out at a comparatively low temperature, at which, in contrast with the procedure according to the known method, the lateral oxidation is larger than the lateral diffusion. The lateral oxidation is then larger than that in the known method, but the lateral diffusion on the contrary is smaller than that in the known method. It is now a surprise to find that with the method according to the invention a semiconductor device comparable with the device described above can be manufactured, in which the formation of a channel zone having a width of about 1 $\mu$m requires an oxidation mask consisting of a bottom layer of silicon oxide and a top layer of silicon nitride having a width of only 1.8 $\mu$m.

Experiments have shown that, in order to obtain a field oxide layer having a thickness of 0.4 $\mu$m with the known method, an oxide layer having a thickness of about 0.5 $\mu$m has to be grown during the first oxidizing heat treatment because during the step of etching away the oxidation mask in practice at least 0.1 $\mu$m of the oxide layer is lost. When forming 0.5 $\mu$m of oxide at a temperature of 1000° C., as in the known method, a lateral diffusion of about 0.8 $\mu$m and a lateral oxidation of about 0.6 $\mu$m occur with the use of an oxidation mask comprising a bottom layer of silicon oxide and a top layer of silicon nitride. With the method according to the invention, for example, first an oxide layer having a thickness of about 0.6 $\mu$m is grown at about 900° C. With the use of the same oxidation mask as in the above case, a lateral oxidation of about 0.8 $\mu$m occurs. Subsequently, during the step of etching away the oxidation mask and during the further etching treatment, this field oxide layer is removed to such an extent that a field oxide layer having a thickness of about 0.4 $\mu$m is left. This layer extends only 0.4 $\mu$m beyond the area at which the edge of the oxidation mask was present so that an apparent lateral oxidation of 0.4 $\mu$m is left. The lateral diffusion is also 0.4 $\mu$m. In order to obtain a channel zone of about 1 $\mu$m, in the known method an oxidation mask having a width of 2.6 $\mu$m is required, whereas in the method according to the invention an oxidation mask having a width of 1.8 $\mu$m is required.

By the further etching treatment, silicon nitride formed at the interface between silicon and oxidation is also removed during the first oxidizing heat treatment. As a result, problems that could be caused by this nitride during the formation of the gate oxide are obviated.

According to the invention, the field oxide layer formed during the first oxidizing heat treatment is preferably etched away to such an extent that a field oxide layer is left having a thickness of 50 to 70% of its original thickness. Thus, without additional processing steps being required, a comparatively flat structure is obtained.

Problems with respect to silicon nitride formed during the first heat treatment at the interface between oxidation mask and silicon when forming the gate oxide are avoided if the slice is subjected between the first and the second oxidizing heat treatment to an additional oxidizing heat treatment and a subsequent etching treatment, in which the silicon oxide then formed is etched away again.

The oxidation mask according to the invention preferably consists of a bottom layer of silicon oxynitride and a top layer of silicon nitride. With such a mask, a channel zone of about 1 μm can be obtained while using an oxidation mask having a width less than 1.2 μm. The width of the oxidation mask may even be 1 μm if the first heat treatment is carried out at a temperature of 825° to 875° C.

Figure 12A:
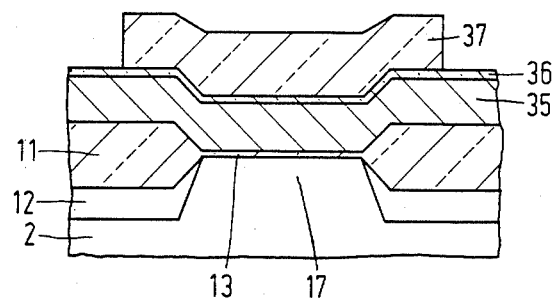
Figure 12B:
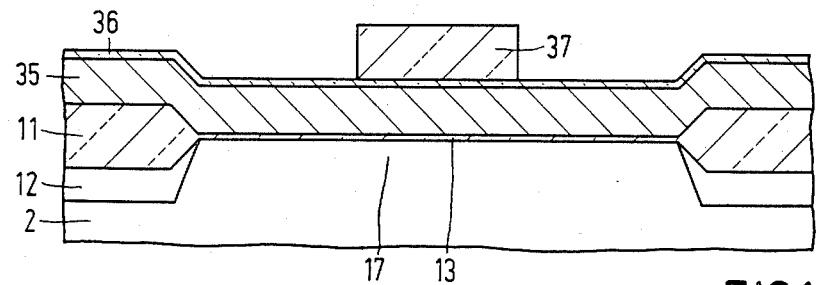
Figure 13A:
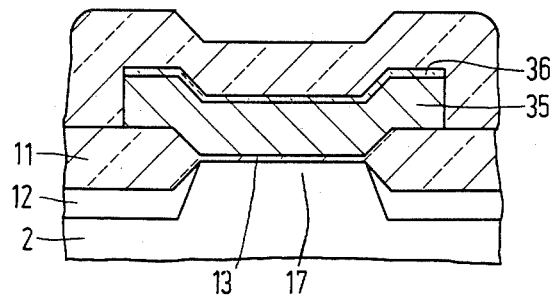
Figure 13B:
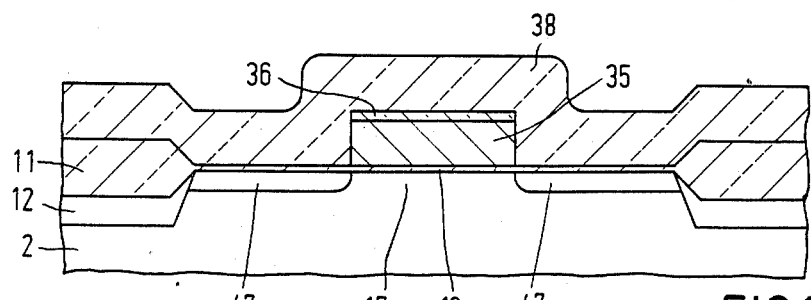

The invention will be described more fully hereinafter, by way of example, with reference to the drawing figures and a few embodiments. In the drawings:

FIGS. 1 to 5 show successive stages of the manufacture of a MOS transistor by means of the method according to the invention, FIGS. 6 to 11 show successive stages of the manufacture of a MOS transistor by means of the method according to the invention, in which a few differences with the stages shown in FIGS. 1 to 5 are illustrated, and FIGS. 12(a and b) to 15(a and b) show the last stages of the manufacture of the MOS transistor.

FIGS. 1 to 5 show successive stages of the manufacture of a MOS transistor. Large numbers of such transistors are used, for example, in electronic memories. The drawings show a surface zone 2 of a silicon slice 1; this slice is, for example, of the p-conductivity type having a doping concentration of about $10^{15}$ atoms/cm$^3$. An oxidation mask 7 is locally provided on a surface 3 of the silicon slice 1. The surface 3 is provided for this purpose in a usual manner by means of thermal oxidation with a silicon oxide layer 4 having a thickness of about 40 nm, which is then covered in a usual manner by means of an LPCVD process with an about 100 nm thick silicon nitride layer 5. Subsequently, a track of photolacquer 6 is provided in a usual manner, after which uncovered parts of the layers of silicon oxide 4 and silicon nitride 5 are etched away. Thus, the desired oxidation mask 7 is formed. The slice 1 is then subjected to a thermal oxidation treatment at about 950° C. in an oxygen-containing gas with an about 25 nm thick silicon oxide layer 8 being formed. The slice 1 is then subjected to an ion implantation with B+ ions having an energy of about 16 keV, in which about $3.10^{13}$ ions/cm$^2$ are implanted. Thus, a surface layer 9 laterally adjoining the oxidation mask 7 is provided with atoms of a dopant.

The slice 1 is now subjected to a first oxidizing heat treatment, in which by oxidation of the part of the slice not covered by the oxidation mask 7 a field oxide layer 10 is formed and by diffusion of the atoms of the dopant in the surface layer 9 a channel stopper zone 12 is formed located beneath the field oxide 10. Subsequently, the slice is subjected to an etching treatment, in which the oxidation mask 7 is removed, while the slice is subjected in a usual manner to a second oxidizing heat treatment at about 950° C. in an oxygen-containing gas, in which a gate oxide layer 13 enclosed by field oxide 11 is formed having a thickness of about 30 nm.

Figure 4:
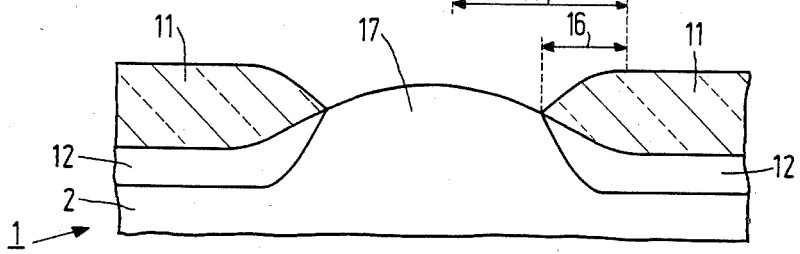
Figure 5:
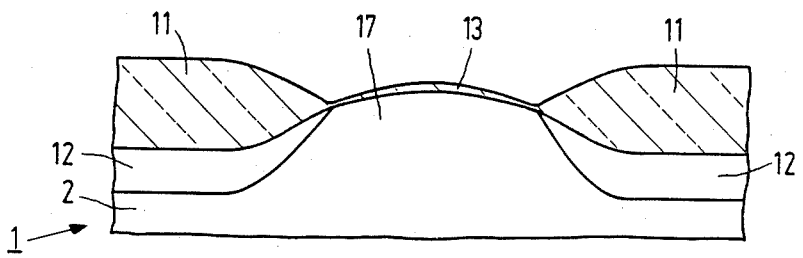
Figure 6:
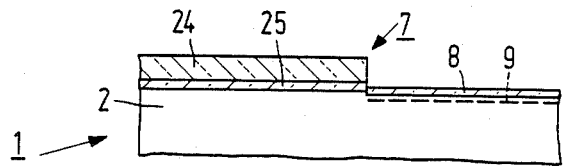
Figure 7:
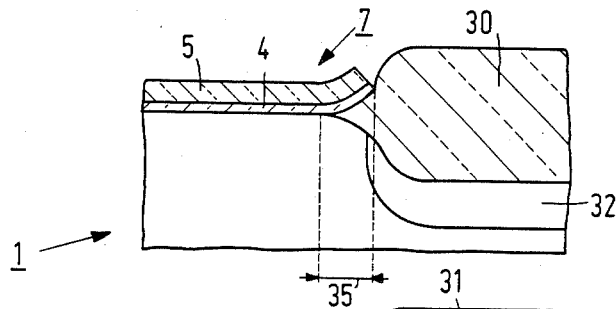
Figure 8:
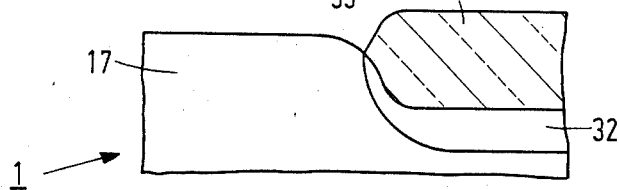

According to the invention, after the oxidation mask 7 has been etched away, the slice 1 is subjected to a further etching treatment, in which also a part of the field oxide layer 10 formed is etched away, this layer becoming thinner and smaller in lateral direction. The situation attained after this further etching treatment is shown in FIG. 4. According to the invention, the first heat treatment is further carried out at a temperature at which a channel stopper zone 12 is formed which extends in lateral direction practically over the same distance as the field oxide layer 11 reduced by the etching treatment. In this embodiment, an about 0.6 μm thick field oxide layer 10 is grown at a temperature of about 900° C. A lateral oxidation—indicated by the arrow 14—of about 0.8 μm and a lateral diffusion—indicated by the arrow 15—of about 0.4 μm then occur. The field oxide layer 10 is removed to such an extent that a field oxide layer 11 remains having a thickness of about 0.4 μm. This layer 11 extends only 0.4 μm beyond the area at which the edge of the oxidation mask 7 was present so that an apparent lateral oxidation indicated by the arrow 16, of 0.4 μm remains. In order to obtain a channel zone 17 of about 1 μm, in this embodiment of the method according to the invention, an oxidation mask 7 is therefore required having a width of about 1.8 μm. Since field oxide 11 and channel stopper 12 both extend 0.4 μm beneath the oxidation mask 7, an amount of 0.8 μm has to be added to the desired 1 μm. The channel zone has a slightly curved surface, but in practice this is not objectionable at all.

Preferably, according to the invention, the field oxide layer 10 formed during the first oxidizing heat treatment is etched away to such an extent that a field oxide layer 11 remains having a thickness of 50 to 70% of its original thickness. In the embodiment, this ratio was about 67%. Thus, without additional processing steps being required, a comparatively flat structure is obtained.

FIGS. 6 to 11 show at the right side successive stages of the manufacture of a MOS transistor, which differs in some respects from the method described above.

The oxidation mask 7 in this embodiment consists of an about 40 nm thick bottom layer 24 of silicon oxynitride and an about 100 nm thick top layer 25 of silicon nitride. In this embodiment, an about 0.6 μm thick field oxide layer 30 is formed at a temperature of 825° to 875° C. A lateral oxidation, indicated by an arrow 35, of about 0.3 μm and a practically negligible lateral diffusion then occur. After the field oxide layer 30 has been reduced by the further etching treatment to the thinner field oxide layer 31, the apparent lateral oxidation is also practically negligible. It has been found that with an oxidation mask 7 of the kind used in this embodiment a channel zone 17 can be obtained using an oxidation mask having a width of less than 1.2 μm.

Figure 9:
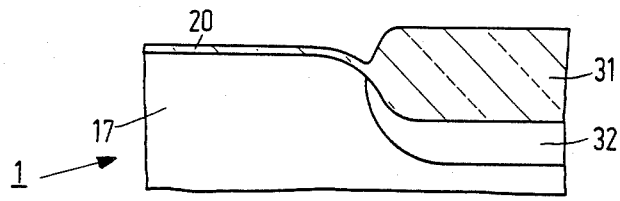
Figure 10:
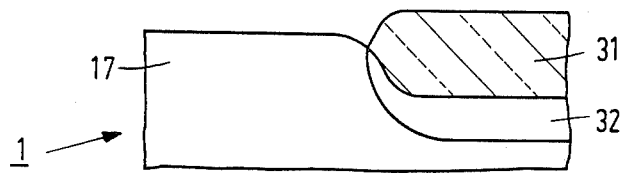
Figure 11:
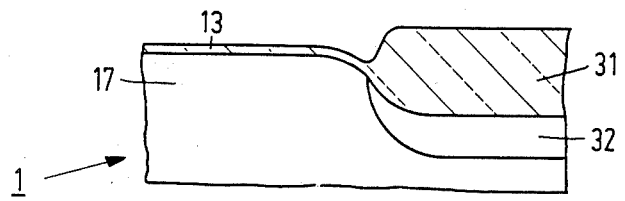

Between the first and the second heat treatment, the slice 1 is subjected to an additional oxidizing heat treatment, in which an oxide layer 20 having a thickness of about 25 nm is formed, which is then etched away again (see FIGS. 9 and 10). By this step, the surface of the channel zone 17 between the layers of field oxide 31 is additionally cleaned, as a result of which problems that may arise due to "white ribbon nitride" are avoided.

The first oxidizing heat treatment is carried out in a dry gas mixture containing oxygen, nitrogen and hydrogen. Thus, the field oxide layer 11,31 can be formed in about 12 hours under atmospheric pressure. The silicon oxynitride layer 24 is preferably deposited by means of an LPCVD process from silane, laughing-gas and ammonia. This is preferably effected so that the layer 24 has a refractive index of 1.6 to 1.8. With the use of such an oxidation mask 7, a channel zone 17 having a width of about 1 μm can be obtained while using an oxidation mask 7 having a width substantially not deviating from 1 μm.

Although the transition between gate oxide 20 and field oxide 31 is much more abrupt than that between gate oxide 23 and field oxide 11 (see FIG. 4), this transition is such that during the further process of manufacturing the MOS transistor, this does not lead to difficulties.

The further procedure of the manufacture of the MOS transistor is explained with reference to FIGS. 12(a and b) to 15(a and b), a and b each time denoting the same state of manufacture, but indicated in two orthogonal cross-sections.

After the gate oxide layer 13 has been provided, a threshold correction implantation with B+ ions at an energy of 25 keV up to a concentration of $5.10^{11}$ atoms/cm$^2$ is carried out in the channel zone, whereupon the slice is covered in a usual manner by means of an LPCVD process by an about 450 nm thick layer of polycrystalline silicon 35, of which an about 50 nm thick top layer 36 is thermally oxidized. A photolacquer mask 37 is provided thereon, after which non-covered parts of the layers 35 and 36 are etched away.

Figure 14A:
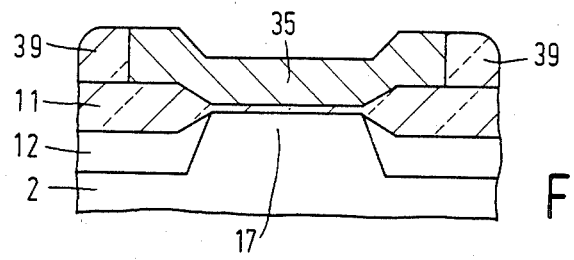
Figure 14B:
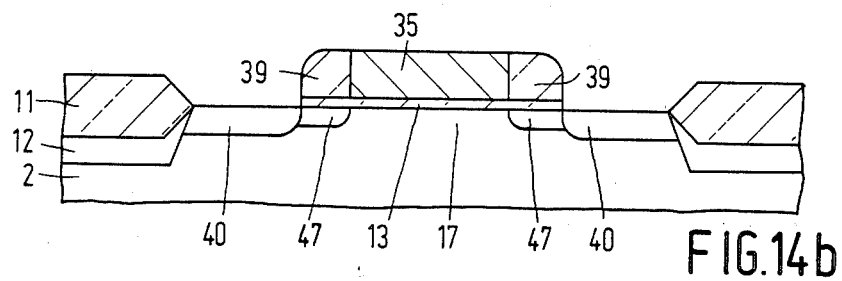
Figure 15A:
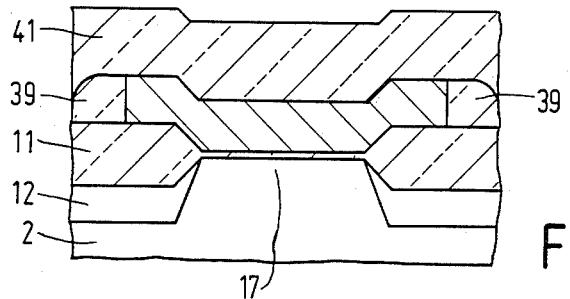
Figure 15B:
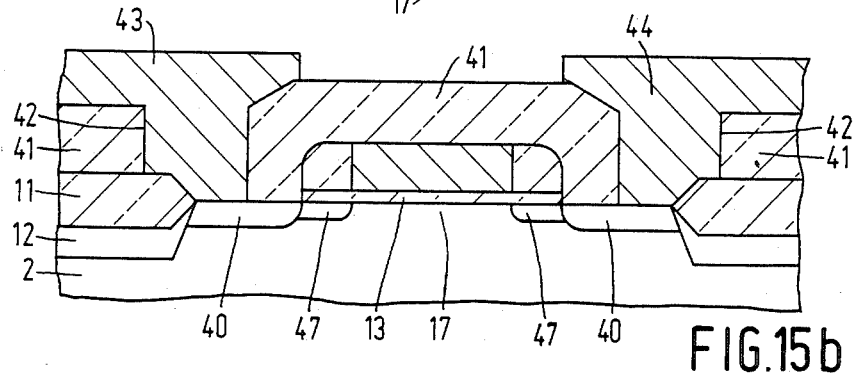

The slice is then subjected to an ion implantation with As ions at an energy of 50 keV, in which surface zones 47 having a doping concentration of about $1.10^{13}$ atoms/cm$^3$ are formed. Subsequently, the slice is covered in a usual manner by means of a CVD process by an about 300 nm thick layer of silicon oxide 38 and is subjected to an anisotropic plasma etching treatment, in which spacers 39 are formed from the silicon oxide layer 38 (see FIGS. 14a and 14b). During a subsequent ion implantation with As ions at an energy of about 40 keV, surface zones 40 having a doping concentration of about $5.10^{15}$ atoms/cm$^3$ are then formed.

Finally, in a usual manner an about 300 nm thick layer of silicon oxide 41 is provided. After windows 42 have been etched therein, the zones 40 can be contacted by aluminium conductors 43 and 44.

What is claimed is:

1. A method of manufacturing a semiconductor device comprising the steps of
   (a) forming an oxidation mask locally on a surface of a silicon slice;
   (b) providing a layer portion of said surface laterally adjacent to said oxidation mask with atoms of dopant;
   (c) subjecting said silicon slice to a first oxidizing heat treatment which forms a field oxide layer on said layer portion adjoining said oxidation mask and which forms a channel stopper zone beneath said field oxide layer by diffusion of said atoms of said dopant into said silicon slice, said channel stopper zone being extended in the lateral direction for a similar amount as said field oxide;
   (d) removing said oxidation mask from said surface of said silicon slice by etching;
   (e) subjecting said silicon slice to a second oxidizing heat treatment to form a gate oxide at said surface of said silicon slice where said oxidation mask has been removed; and
   (f) subjecting said silicon slice to a further etching treatment to etch away a part of said field oxide layer, said field oxide layer becoming thinner and smaller in a lateral direction,
   wherein said silicon slice between said first and said second oxidizing heat treatment is subjected to an additional oxidizing heat treatment, and subsequent etching is carried out to etch away silicon oxide formed by said additional oxidizing heat treatment.

2. A method according to claim 1, wherein said field oxide layer formed during said first oxidizing heat treatment is etched away to a thickness of 50 to 70% of an original thickness.

3. A method according to claim 1 or claim 2, wherein said oxidation mask is formed of a first layer of silicon oxynitride on said silicon slice and a second layer of silicon nitride on said first layer.

4. A method according to claim 3, wherein said first oxidizing heat treatment is carried out in a temperature range of 825° to 875° C.

5. A method according to claim 4, wherein said first oxidizing heat treatment is carried out in a dry gas mixture containing oxygen, nitrogen and hydrogen.

6. A method according to claim 3, wherein said first layer of silicon oxynitride is deposited by an LPCVD process from silane, laughing-gas and ammonia.

7. A method according to claim 6, wherein said LPCVD process is carried out to provide a refractive index of 1.6 to 1.8 to said silicon oxynitride.

8. A method of manufacturing a semiconductor device comprising the steps of
   (a) forming an oxidation mask locally on a surface of a silicon slice;
   (b) providing a layer portion of said surface laterally adjacent to said oxidation mask with atoms of dopant;
   (c) subjecting said silicon slice to a first oxidizing heat treatment which forms a field oxide layer on said layer portion adjoining said oxidation mask and which forms a channel stopper zone beneath said field oxide layer by diffusion of said atoms of said dopant into said silicon slice, said channel stopper zone being extended in the lateral direction for a similar amount as said field oxide;
   (d) removing said oxidation mask from said surface of said silicon slice by etching
   (e) subjecting said silicon slice to a second oxidizing heat treatment to form a gate oxide at said surface of said silicon slice where said oxidation mask has been removed; and
   subjecting said silicon slice to a further etching treatment to etch away a part of said field oxide layer, said field oxide layer becoming thinner and smaller in a lateral direction,
   wherein said channel stopper zone is extended in a lateral direction for a similar amount as said field oxide layer.

9. A method according to claim 8, wherein said field oxide layer formed during said first oxidizing heat treatment is etched away to a thickness of 50 to 70% of an original thickness.

10. A method according to claim 8 or claim 9, wherein said oxidation mask is formed of a first layer of silicon oxynitride on said silicon slice and a second layer of silicon nitride on said first layer.

11. A method according to claim 10, wherein said first oxidizing heat treatment is carried out in a temperature range of 825° to 875° C.

12. A method according to claim 11, wherein said first oxidizing heat treatment is carried out in a dry gas mixture containing oxygen, nitrogen and hydrogen.

13. A method according to claim 10, wherein said first layer of silicon oxynitride is deposited by an LPCVD process from silane, laughing-gas and ammonia.

14. A method according to claim 7, wherein said LPCVD process is carried out to provide a refractive index of 1.6 to 1.8 to said silicon oxynitride.

* * * * *